United States Patent
Breitwisch et al.

(10) Patent No.: US 7,691,684 B2
(45) Date of Patent: Apr. 6, 2010

(54) FIN-TYPE ANTIFUSE

(75) Inventors: Matthew J. Breitwisch, Essex Junction, VT (US); Chung H. Lam, Peekskill, NY (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 54 days.

(21) Appl. No.: 12/183,169

(22) Filed: Jul. 31, 2008

(65) Prior Publication Data
US 2008/0286905 A1   Nov. 20, 2008

Related U.S. Application Data (62) Division of application No. 10/711,845, filed on Oct. 8, 2004, now Pat. No. 7,456,426.

(51) Int. Cl.
*H01L 21/82* (2006.01)

(52) U.S. Cl. .................. 438/131; 438/467; 438/600; 257/50; 257/530; 257/E21.346; 257/E21.592

(58) Field of Classification Search .......... 438/131, 438/467, 600, 957; 257/50, 530, E21.346, 257/E21.592
See application file for complete search history.

(56) References Cited

U.S. PATENT DOCUMENTS

| | | | |
|---|---|---|---|
| 5,095,362 | A | 3/1992 | Roesner |
| 5,166,556 | A | 11/1992 | Hsu et al. |
| 5,469,379 | A | 11/1995 | Levy |
| 5,502,395 | A | 3/1996 | Allen |
| 5,899,707 | A | 5/1999 | Sanchez et al. |
| 2002/0063305 | A1 | 5/2002 | Koike |
| 2002/0105452 | A1 | 8/2002 | Clapp et al. |
| 2002/0140051 | A1 | 10/2002 | Knall et al. |
| 2003/0132504 | A1 | 7/2003 | Bertin et al. |
| 2006/0128071 | A1* | 6/2006 | Rankin et al. ............ 438/131 |

* cited by examiner

*Primary Examiner*—Thien F Tran
(74) *Attorney, Agent, or Firm*—Gibb I.P. Law Firm, LLC; Richard M. Kotulak, Esq.

(57) ABSTRACT

A method of forming an antifuse forms a material layer and then patterns the material layer into a fin. The center portion of the fin is converted into a substantially non-conductive region and the end portions of the fin into conductors. The process of converting the center portion of the fin into an insulator allows a process of heating the fin above a predetermined temperature to convert the insulator into a conductor. Thus, the fin-type structure that can be selectively converted from an insulator into a permanent conductor using a heating process.

17 Claims, 7 Drawing Sheets

FIN-TYPE ANTIFUSE

CROSS-REFERENCE TO RELATED APPLICATIONS

This application is a Division of U.S. application Ser. No. 10/711,845 filed Oct. 8, 2004, the complete disclosure of which, in its entirety, is herein incorporated by reference.

BACKGROUND OF THE INVENTION

1. Field of the Invention

The invention generally relates to a method of forming an antifuse and the resulting structure which includes a fin structure that can be converted from an insulator into a permanent conductor through a heating process.

2. Description of the Related Art

Fuses and antifuses are useful in today's integrated circuit devices to selectively connect and disconnect devices from other portions of the circuit, as well as to provide logical operations. For example, a fuse is often activated (blown, opened, etc.) in order to disrupt or break an electrical connection. Similarly, a fuse can be blown to dramatically increase the resistance of a circuit, thereby providing a logical distinction between the activated and unactivated fuse device.

Antifuses operate in an opposite manner to that of fuses. Thus, antifuses are generally non-conductive (highly resistive) when unactivated (unblown) and become conductors when activated (blown). Therefore, when an antifuse is activated, it forms an electrical connection, as opposed to a fuse which breaks an electrical connection when activated. Thus, an antifuse selectively allows a conductive connection to be made to selectively connect portions of a circuit together, thereby potentially engaging a previously disconnected device into a circuit. Similarly, an antifuse provides different resistance values which can be utilized to perform logical operations.

Once a fuse or antifuse is activated, the fuse generally cannot be unactivated. Therefore, the activation is generally a one-time event and is used to permanently modify a circuit. Low process cost and relatively high density are required for fuses and antifuses. Electrically blowing metal fuses is one conventional method for activating a fuse, but requires precise electrical and physical control to be reliable. The invention described below provides much smaller and easily activated antifuses and methods for making the same.

SUMMARY OF THE INVENTION

This disclosure presents a method of forming an antifuse and the resulting structure. The invention forms a material layer and then patterns the material layer into a fin. Next, the invention converts the center portion of the fin into a high-resistance conductor and the end portions of the fin into conductors. The process of converting the center portion of the fin into a high-resistance conductor (substantially non-conductive) allows a process of heating the fin above a predetermined temperature to convert the high-resistance conductor into a low-resistance conductor (substantially conductive). Thus, the invention provides a fin-type structure that can be selectively converted from a high-resistance conductor into a low-resistance conductor using a simple heating process.

In the process of converting the center portion of the fin into a high-resistance conductor, the ends of the fin are masked such that the center portion of the fin is unprotected, and then ions are implanted into the center portion of the fin. This process changes the center portion of the fin into an amorphous material. Thus, for example, this process of converting the center portion of the fin into a high-resistance conductor changes the center portion from single-crystal silicon to amorphous silicon. The subsequent selective heating of the fin changes the center portion of the fin into polycrystalline silicon. The selective heating of the fin that activates the antifuse changes the conductivity level of the center portion of the fin to be many times more conductive (e.g., 10 times more conductive) after being heated above the predetermined temperature when compared to the conductivity level of the center portion before heating. In a similar manner, the process of converting the end portions of the fin into conductors can comprise protecting the center portion of the fin, and then siliciding the end portions of the fin.

In another embodiment, the invention forms a directional antifuse that has a preferred direction of condition (bias) before and after being activated. This embodiment again patterns a material layer into a fin. The end portions of the fin are converted into a P-type end and an N-type end and the center portion of the fin is converted into a P-N junction. This process of converting the center portion of the fin into the P-N junction allows a process of heating the fin above a predetermined temperature to permanently change characteristics of the P-N junction.

More specifically, the process of converting the center portion of the fin into a P-N junction comprises masking ends of the fin such that the center portion of the fin is unprotected. Then ions are implanted into the center portion of the fin. The process of implanting ions into the center portion of the fin changes the center portion of the fin into an amorphous material. The process of converting the end portions of the fin into conductors comprises protecting the center portion of the fin, protecting the N-type end and implanting P-type impurities into the P-type end, and protecting the P-type end and implanting N-type impurities into the N-type end. These N-type impurities and the P-type impurities comprise opposite type impurities. After the P-type and N-type impurities are implanted into the ends of the fin, the fin is heated sufficiently to drive impurities from the ends of the fin into the center of the fin.

The heating of the fin decreases the density of mid-gap states of the center portion of the fin by, typically two to three orders of magnitude, compared to the level of the center portion before heating. Thus currents across the P-N junction when reverse biased are decreased by two or more orders of magnitude (e.g., suppress by 100× or more) after heating.

One of the antifuse structures provided by the invention comprises a fin having a center portion and end portions. The center portion of the fin comprises an insulator adapted to permanently become a conductor when heated above a predetermined temperature and the end portions comprise permanent conductors.

In this structure, the center portion of the fin comprises an amorphous material that is many times more conductive after being heated above the predetermined temperature when compared to a conductivity level of the center portion before heating. For example, the center portion can comprise single crystal silicon before being heated above the predetermined temperature and is changed to polycrystalline silicon after being heated above the predetermined temperature. The end portions comprise a permanent conductor, such as silicide regions of the fins.

The size (length) of the center portion of the fin is restricted such that, for example, the center portion comprises a very small portion (less than approximately 10 percent) of the length of the fin. Further, the fin is a rectangular structure that extends from a substrate and is more than a conventional rectangular wire. Thus, for example, the fin has a height and length that exceeds more than many times (e.g., 2 or more times) the width of the fin.

In the embodiment of the antifuse that has a bias (similar to a diode), the center portion of the fin comprises a P-N junction adapted to permanently change characteristics when heated above a predetermined temperature and the end portions comprise a P-type end and an N-type end. Again in this embodiment, the center portion of the fin can comprises an amorphous material, which can comprise, for example, single crystal silicon before being heated above the predetermined temperature and polycrystalline silicon after being heated above the predetermined temperature.

These and other aspects of embodiments of the invention will be better appreciated and understood when considered in conjunction with the following description and the accompanying drawings. It should be understood, however, that the following description, while indicating preferred embodiments of the invention and numerous specific details thereof, is given by way of illustration and not of limitation. Many changes and modifications may be made within the scope of the embodiments of the invention without departing from the spirit thereof, and the invention includes all such modifications.

BRIEF DESCRIPTION OF THE DRAWINGS

The embodiments of the invention will be better understood from the following detailed description with reference to the drawings, in which.

DETAILED DESCRIPTION OF PREFERRED EMBODIMENTS OF THE INVENTION

The invention presents a method of forming an antifuse and the resulting structure. The inventive method and structure produce antifuses that use fin technology. Therefore, the inventive antifuses are smaller than conventional fuses. Thus, the invention takes advantage of the fact that a fin of silicon is of very low mass (fractions of a picogram) and thus is easily heated electrically. The invention provides an inexpensive technique to make the antifuse change resistance by a large amount (e.g., 10×) permanently after a pulse of heating current is passed through the fin. Because of the small area (mass) of the inventive structure, the operation of activating (blowing) the antifuse involves a simplified heating process that is performed by passing current through the antifuse. Therefore, not only does the invention produce smaller antifuses than are conventionally available, the invention also provides a method of activating the antifuses that avoids the problems that can occur during conventional physical/optical antifuse activation.

Figure 1:
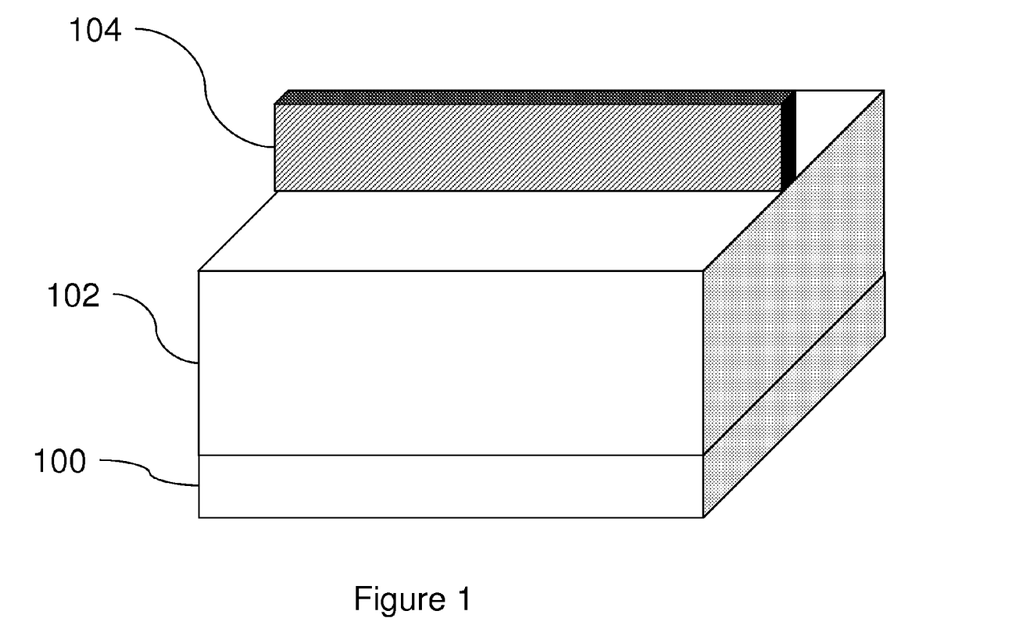
FIG. 1 is a schematic diagram of a partially completed antifuse according to the invention.
Figure 2:
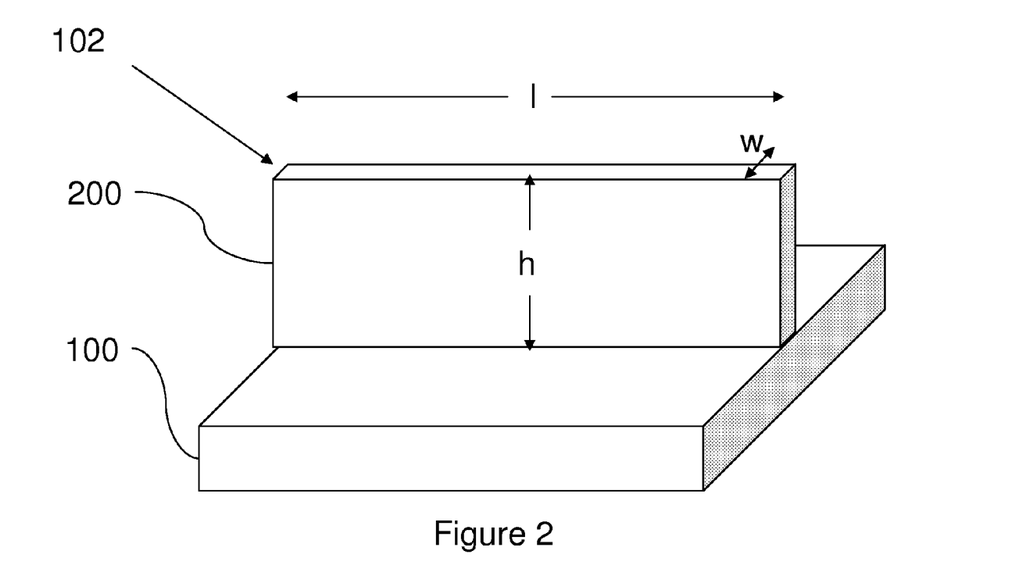
FIG. 2 is a schematic diagram of a partially completed antifuse according to the invention.
Figure 3:
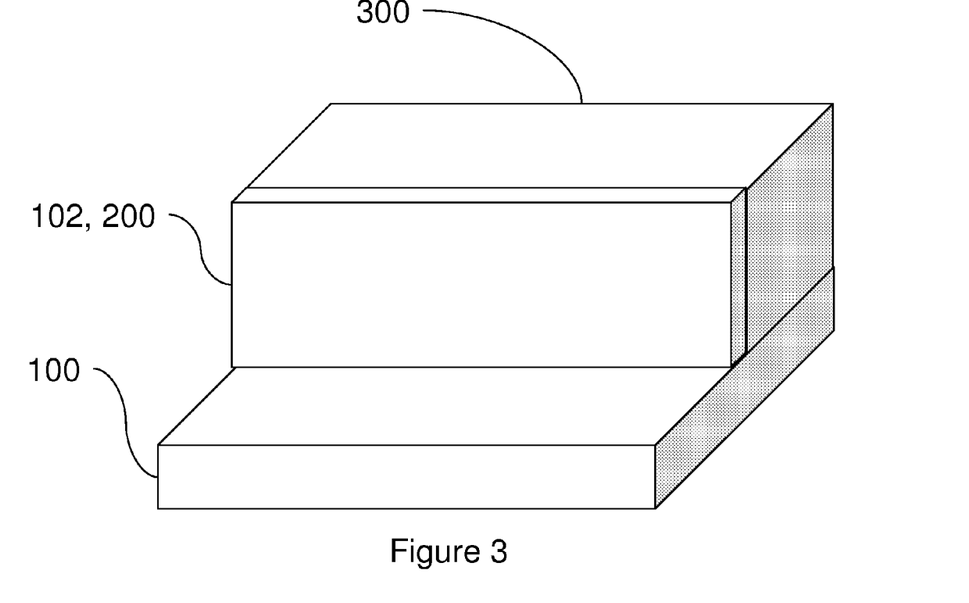
FIG. 3 is a schematic diagram of a partially completed antifuse according to the invention.

FIGS. 1-3 illustrate some non-limiting ways in which the fin structure may be formed. As shown in FIG. 1, the invention forms a material layer 102 (such as single crystal silicon, silicon-germanium, etc.) on a substrate 100 (a silicon wafer, a SOI wafer, etc.). A mask 104 (such as an organic photoresist, etc.) is patterned over the material 102 and a common material removal process such as etching, chemical treatment, etc. is used to remove the exposed portion of the material 102 to leave a freestanding fin 200. Note that the fin 200 is a rectangular structure that extends from the substrate 100 and is more than a conventional rectangular wire. Thus, for example, the fin has a height (h) and length (l) that exceeds more than 2 times the width (w) of the fin.

An alternative method to form the fin 200 is shown in FIG. 3. This method is sometimes referred to as sidewall spacer technology. In this method, a placeholder 300 is patterned on the substrate 100 using conventional techniques such as photolithography. Then, the material 102 is deposited over the placeholder 300. Next, a selective directional etching process is utilized to remove the material 102 from horizontal surfaces at a higher rate than it removes material from vertical surfaces. This leaves the material 102 only on the side walls of the placeholder 300. The upper surface of the structure is then preferably polished to remove any excess material 102, leaving the fin structure 200 shown in FIG. 3. After this, the placeholder 300 is removed resulting in the structure shown in FIG. 2.

Figure 4:
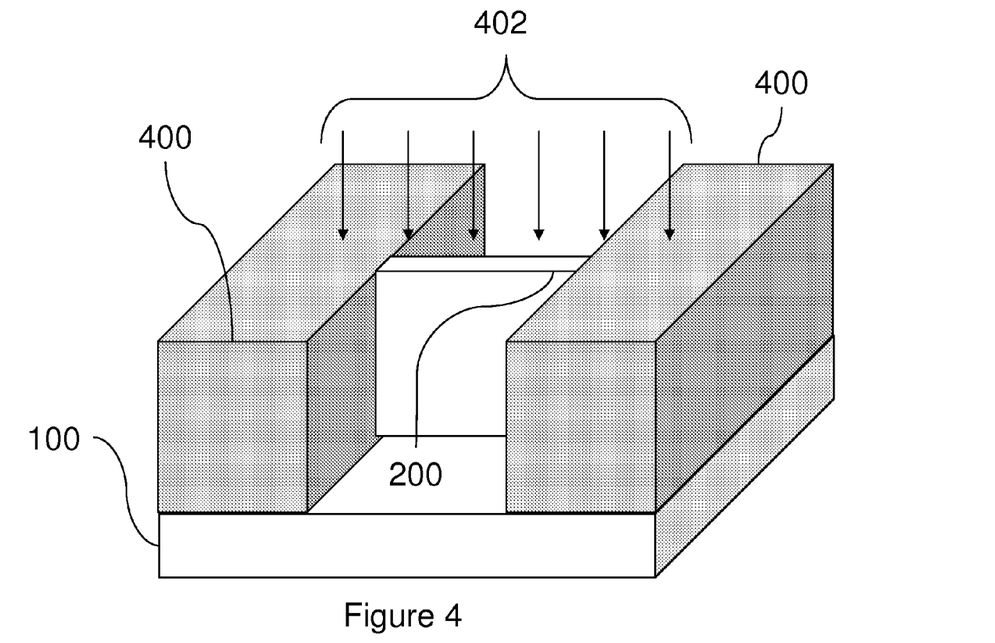
FIG. 4 is a schematic diagram of a partially completed antifuse according to the invention.

FIG. 4 illustrates the process of converting the center portion of the fin 200 into an insulator. In FIG. 4, the previous masks are removed and the ends of the fin are protected using another mask, such as a photoresist 400. The center portion of the fin is left unprotected. Then, high-mass ions 402 (such as silicon, germanium, arsenic, xenon, etc.) are implanted into the center portion of the fin 200. This ion implant 402 is sufficient to make the central portion of the fin 200 and amorphous insulating material. For example, the ion implant energies can be between approximately 0.5 keV and approximately 3 keV with a normal dosage in the range of $1 \times 10^{14}$ cm$^{-2}$ to $5 \times 10^{14}$ cm$^{-2}$. Once again, this process changes the center portion of the fin 200 into an amorphous material. Thus, for example, this process of converting the center portion of the fin into an insulator changes the center portion of a silicon fin into a region of amorphous silicon.

Figure 5:
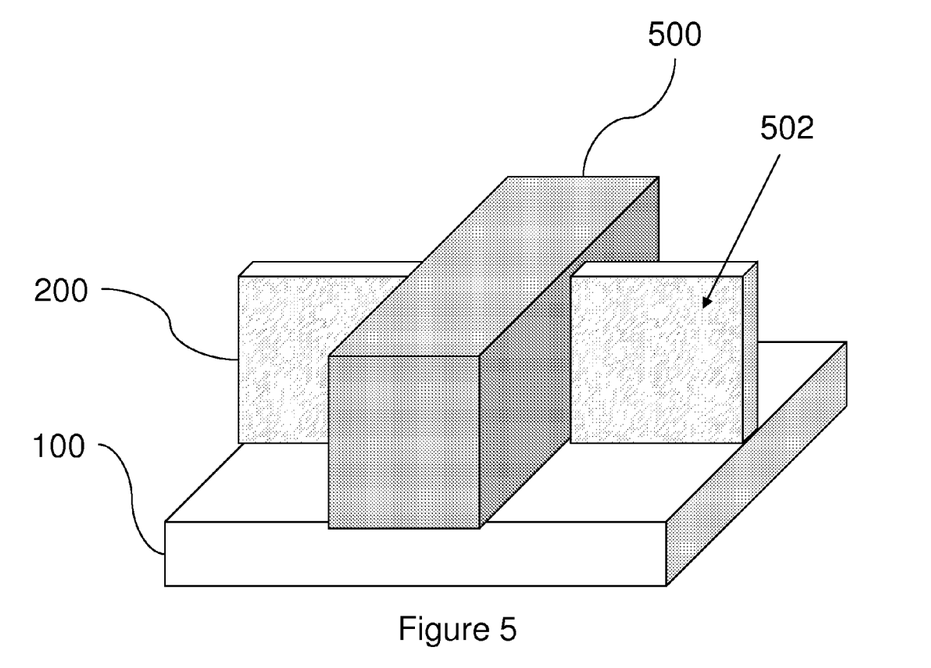
FIG. 5 is a schematic diagram of a partially completed antifuse according to the invention.

In FIG. 5, the previous masks are removed and another mask 500, that is similar to the previous masks discussed above, is patterned to protect the center portion of the fin 200 and allow the ends of the fin to be exposed. The exposed portions of the fin are converted into conductors by implanting an impurity in sufficient quantity to make the ends of the fin 200 conductive. Alternatively, the ends of the fins 200 can be silicided 502 in a process that heats the fin in a metal containing ambient. In addition, as would be understood by one ordinarily skilled in the art given this disclosure, many additional methods can be utilized to make the ends of the fin 200 conductive. Then the mask 500 is removed leaving the structure shown in FIG. 6 that includes a high-resistance center section 600 and conductive ends 602, 604.

Figure 6:
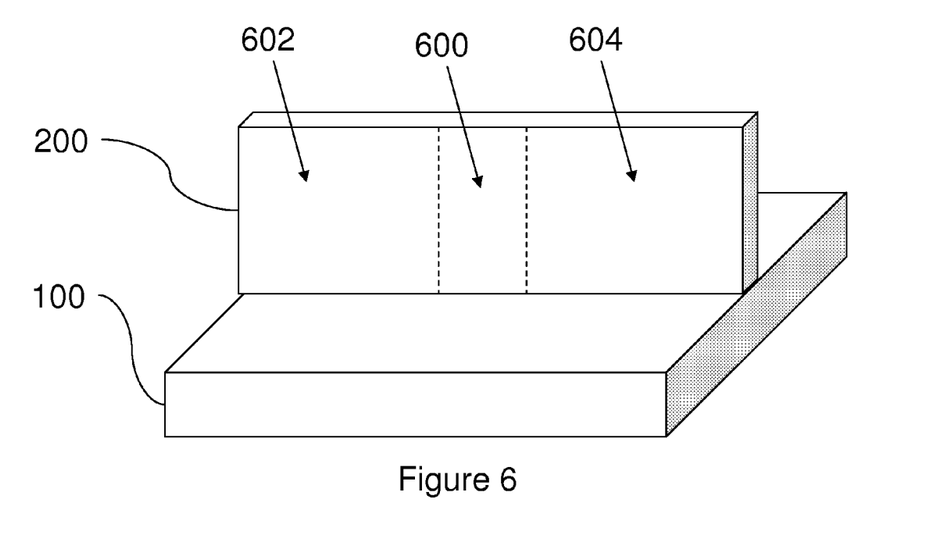
FIG. 6 is a schematic diagram of a completed antifuse according to the invention.

Thus, the invention converts the center portion 600 of the fin into a high-resistance (substantially non-conductive) region and the end portions 602, 604 of the fin into conductors. The process of converting the center portion of the fin into a high-resistance region allows a subsequent process of heating the fin above a predetermined temperature to convert the high-resistance region into a low-resistance region. Thus, the invention provides a fin-type structure that can be selectively converted from a high-resistance conductor into a permanent low-resistance conductor using a simple heating process.

In another embodiment, shown in FIGS. 7-10, the invention forms a directional antifuse that has a preferred direction of conduction (bias) before and after being activate. This antifuse operates as a P-N junction in a similar manner that a diode operates, except that the activation of the P-N junction within the fin 200 changes the characteristics of the P-N junction dramatically allowing the antifuse to be easily utilized as a logical device. In this embodiment, the end portions of the fin are converted into a P-type end and an N-type end and the center portion of the fin is converted into a P-N junction. This process of converting the center portion of the fin into the P-N junction allows a process of heating the fin above a predetermined temperature to permanently change characteristics of the P-N junction.

Figure 7:
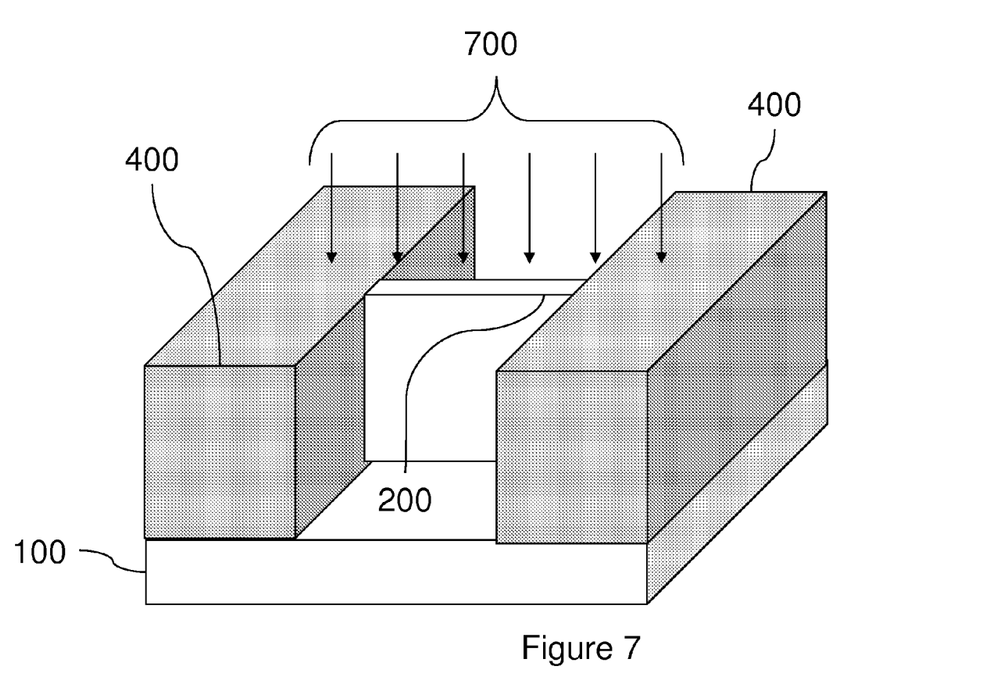
FIG. 7 is a schematic diagram of a partially completed antifuse according to the invention.

More specifically, as shown in FIG. 7, the process of converting the center portion of the fin 200 into a P-N junction comprises masking ends of the fin 200 (again using a mask such as mask 400) such that the center portion of the fin 200 is unprotected. Then ions, preferably of the silicon or germanium with a normal dosage in the range of $1\times10^{14}$ cm$^{-2}$ to $5\times10^{14}$ cm$^{-2}$, are implanted into the center portion of the fin as indicated by item 700. The process of implanting ions into the center portion of the fin changes the center portion of the fin into an amorphous or polycrystalline semiconductor with a high density of mid-gap states.

The density of mid-gap states in the junction of a P-N diode strongly influences two important characteristics of the electrical conduction of such a diode, namely, the reverse-bias leakage, and the forward-bias ideality. The reverse-bias leakage is typically a very low current density (~1 pA/cm$^2$), however, when a high density of mid-gap states is introduced into the junction region, this reverse-bias current can increase many factors of ten. The forward-bias conduction current grows exponentially with forward voltage with an exponential factor of $enkT/Qe$, where k and Qe are Boltzmann's constant and the unit of electric charge, respectively, T is the temperature of the junction an n is a number, typically between 1 and 2, called the ideality factor. For low densities of mid-gap states n~1, while for large densities of mid-gap states, n~2.

Figure 8:
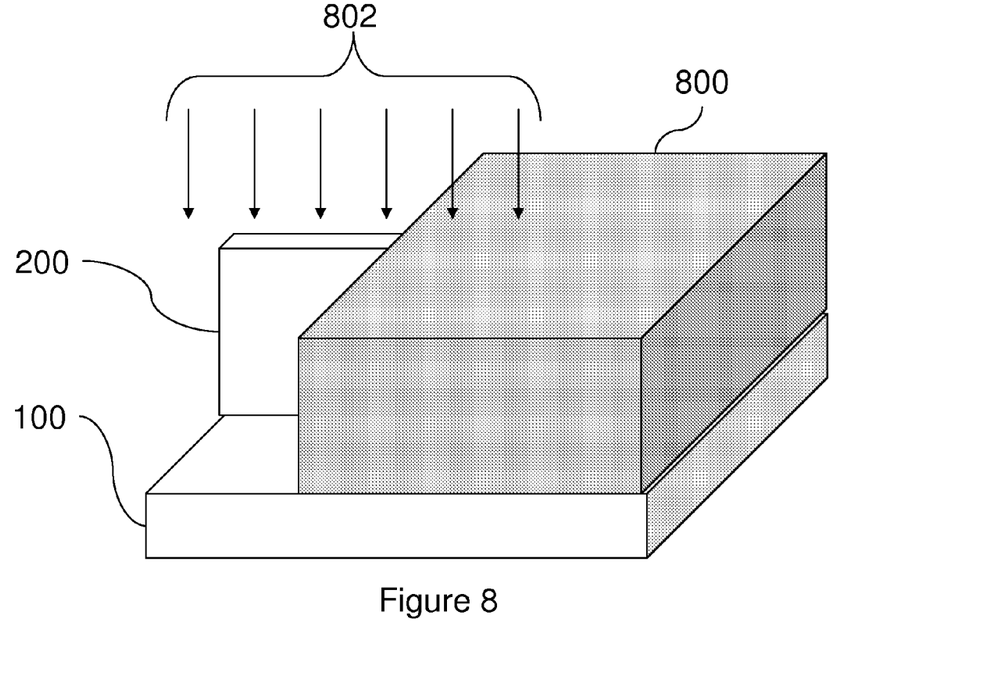
FIG. 8 is a schematic diagram of a partially completed antifuse according to the invention.
Figure 9:
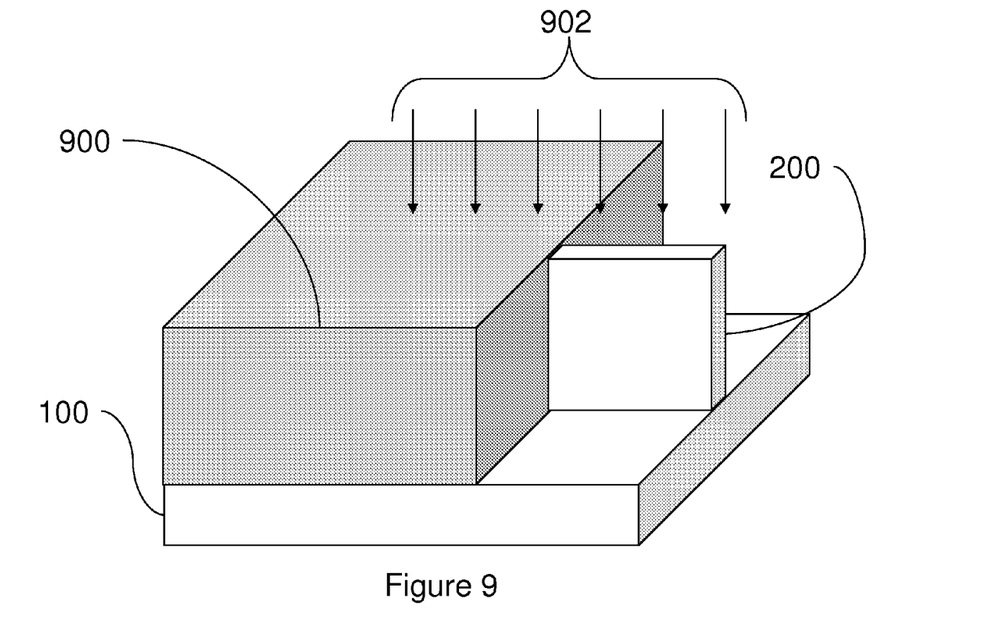
FIG. 9 is a schematic diagram of a partially completed antifuse according to the invention.

The process of converting the end portions of the fin into N-type and P-type regions comprises a two-step process that protects one of the ends and the center portion of the fin while the other end is implanted with a doping impurity. More specifically, as shown in FIG. 8, a mask 800 is formed over one end of the fin 200 and over the center section of the fin 200, leaving only the other end of the fin exposed. Then an impurity 802 is implanted into the exposed end of the fin. Similarly, as shown in FIG. 9, the first mask 800 is removed and a second mask 900 used to cover the previously exposed portion of the fin 200 and the center portion of the fins 200. Then, an opposite type of doping impurity 902 is implanted into the exposed portion of the fin. If desired, additional masking can be performed in this process. For example, an additional mask similar to the mask 500 shown in FIG. 5, above, can be used in conjunction with this process. After the mask 900 is removed, the fin 200 will include a first type of impurity region 112 (e.g., P-type), a center highly resistive amorphous region 110, and opposite type doped impurity region 114 (e.g., N-type).

Thus, this process involves protecting the N-type end 114 and implanting P-type impurities 802 into the P-type end 112, and protecting the P-type end 112 and implanting N-type impurities 902 into the N-type end 114. These N-type impurities and the P-type impurities comprise opposite type impurities. For example, the N-type impurities 902 can comprise arsenic, phosphorus, etc. while the P-type impurities 802 can comprise boron, etc. As would be understood by one ordinarily skilled in the art in light of this disclosure, the actual impurities that are used can change depending upon the materials used in the antifuse. Indeed, any combination of substances can be used so long as those substances cause the fin to act in a biased manner such that current is encouraged to flow primarily in one direction. After the P-type and N-type impurities are implanted into the ends of the fin, the fin is heated sufficiently to activate the impurities, typically using anneals of 800° C. to 1050° C. for between 1s to 30s. As mentioned above, in order to activate the fuse, current is passed through the fin, which causes the fin to heat. A forward voltage of between 1 and 2 Volts is applied to the diode for 0.01s to 5s to achieve temperatures of between 500° C. and 700° C., which are typically sufficient to accomplish the structural change to larger polycrystalline semiconductor grains and a lower average density of mid-gap states.

Figure 11:
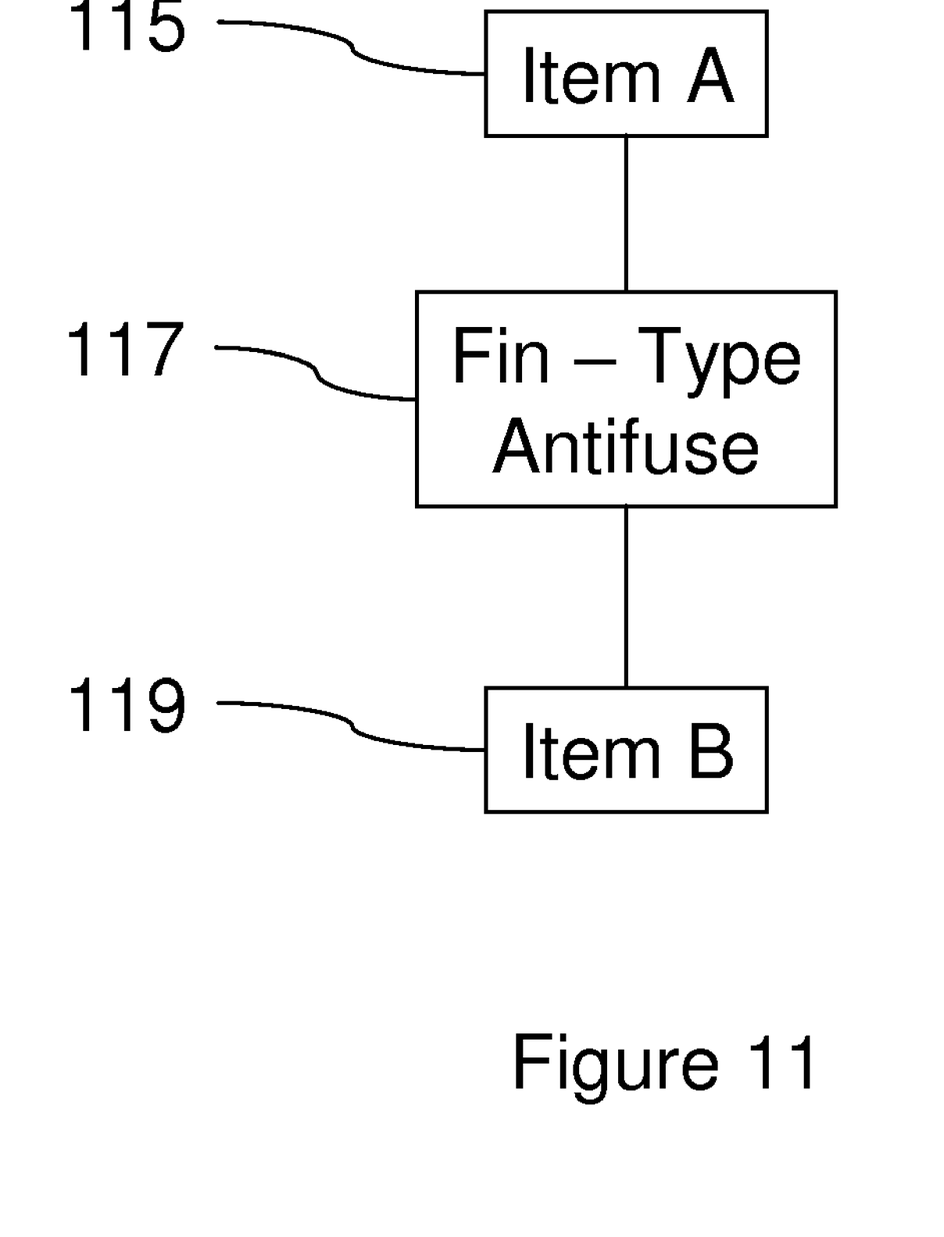
FIG. 11 is a schematic diagram of inventive antifuse used within a circuit.

Therefore, after the antifuse is manufactured, it is utilized within a circuit to form a connection or perform a logical function. FIG. 11 illustrates a simplified schematic diagram of the inventive antifuse 117 electrically connected by wiring to two items, item A 115 and item B 119. Items A and B can comprise any type of item, such as a voltage source, controller, transistor, capacitor, etc. In one example, it may be desirable to connect item A to item B. In this case, the antifuse 117 would comprise the embodiment shown in FIG. 6 and sufficient current or voltage would be generated through the fin 200 to heat the center portion 600 fin to a sufficient temperature to change the center portion 600 to a conductor. This would make the antifuse a permanent conductor between items A and B. If item A were not to be connected to item B, the antifuse would not undergo the heating process.

Figure 10:
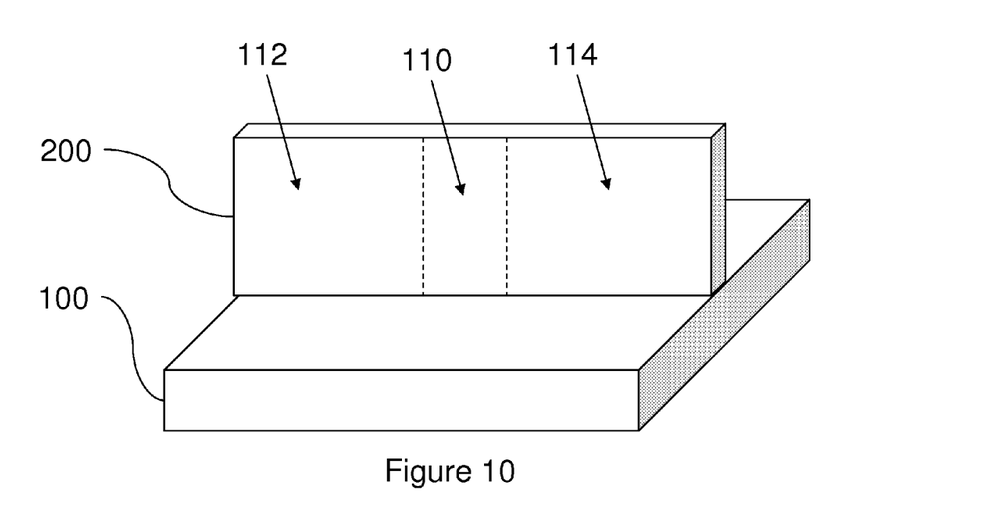
FIG. 10 is a schematic diagram of a completed antifuse according to the invention.

Alternatively, the antifuse 117 could represent the antifuse shown in FIG. 10 and item A could represent a logical device and item B could comprise a voltage source. In its unactivated state, the antifuse 117 would provide one type of characteristic, namely the reverse-bias conduction current would be 100 to 1000 times that of the heated (annealed) antifuse. Thus, before the center portion of said fin is heated, the center portion of said fin has a reverse-bias leakage that is more than 100 times higher than the reverse-bias leakage after the center portion of said fin is heated. Additionally, the electrical conduction in the regime of 50 mV to 350 mV forward bias, would be characterized by an ideality factor, n=2, which could represent one logical value. If this logical value were to be changed to an opposite logical value, the antifuse could be activated as described above by heating. Then, after activation, the antifuse would provide the opposite type of characteristic, namely lower reverse-bias conduction (100 to 1000 times lower reverse-bias conduction) or a forward-bias ideality factor, n=1, thereby providing item A with a different logical answer when accessing the antifuse 117. In the case that the antifuse in 117 represents the antifuse shown in FIG. 6, the high-resistance state would initially exist due to the amorphous region 600 and could represent on logical value. A voltage would be provided on the antifuse where programming is desired, to heat the amorphous region 600, thereby converting the region 600 to a low-resistance (conductor) state, which could represent a second logical value.

With respect to the heating that occurs within the center portion of 600, 110 of the fin 200, a narrower center portion allows a lower voltage to be utilized when performing the heating operation. Therefore, the masks 400 that are utilized should be patterned to make the center portion 600, 110 of the fin 200 and small as possible along the length of the fin 200. This requirement is balanced against the need for the center portion of the fin 200 to remain a high-resistance region before the antifuse is activated. Therefore, while each design will have different parameters, the length of the center portion 600, 110 of the fin 200 should be minimized to the greatest extent possible to reduce the amount of voltage required to generate the necessary heating. Thus, in one example, the size (length) of the center portion of the fin is restricted such that, for example, the center portion comprises less than approximately 5 to 10 percent of the length of the fin.

The subsequent selective heating of the fin changes the center portion of the fin into polycrystalline silicon. The selective heating of the fin that activates the antifuse in the embodiment shown in FIG. 6, changes the conductivity level of the center portion of the fin to be many times (e.g., 10 or more times) more conductive after being heated above the predetermined temperature when compared to the conductivity level of the center portion before heating. In the embodiment shown in FIG. 10, the amorphization of the fin increases the mid-gap density of states of the center portion of the fin to be many times (e.g., 100 or more times) that found in the unamorphized fin. Heating of this amorphized region decreases the density of states to a value nearby that of the original unamorphized fin, in the range of $<10^{17}$ cm$^{-3}$ eV$^{-1}$.

Figure 12:
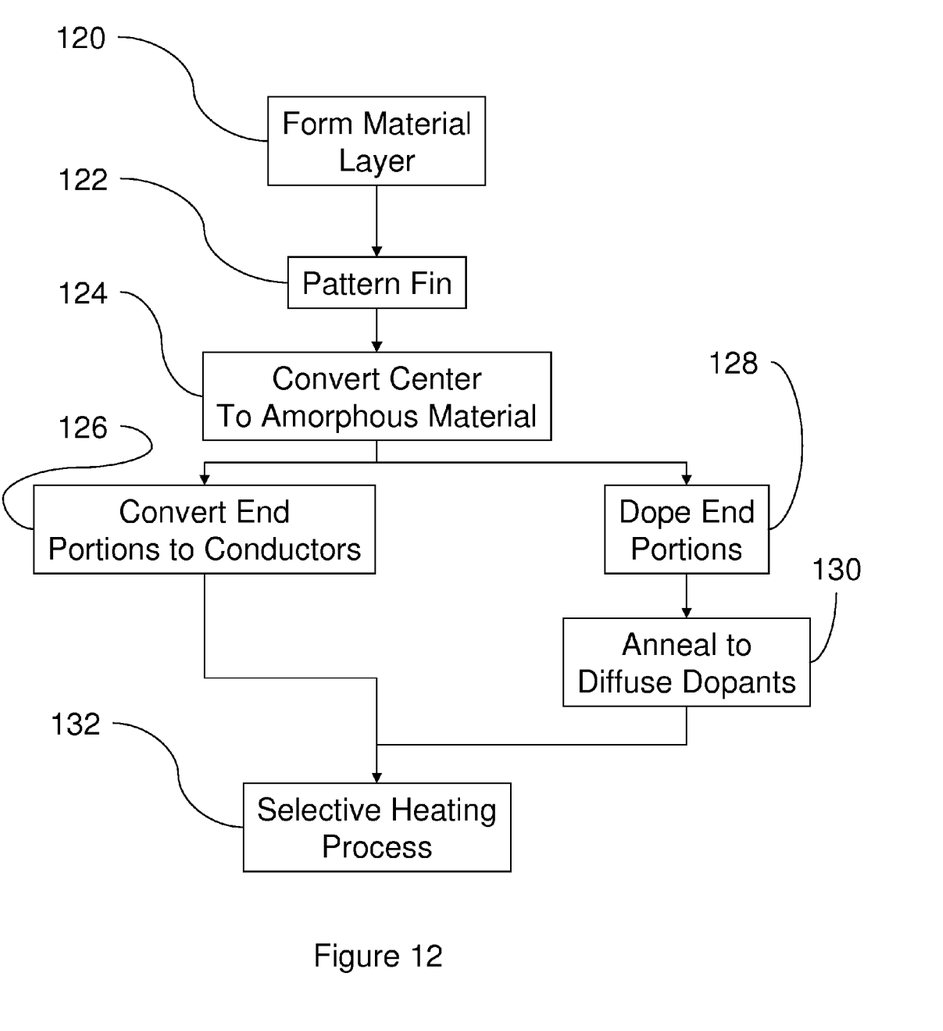
FIG. 12 is a flow diagram illustrating the inventive methodology.

FIG. 12 illustrates the methodology of the invention in flowchart form. More specifically, in item 120, the invention forms a material layer and then patterns the material layer into a fin in item 122. Next, the invention converts the center portion of the fin into an amorphous material (124) and converts the end portions of the fin into conductors (126) for them embodiment shown in FIG. 6, or dopes the end portions of the fin using opposite type dopants (128), for the embodiment shown in FIG. 10. For the embodiment shown FIG. 10, the structure is then annealed to drive the dopants into the central region of the fin in item 130. The process of converting the center portion of the fin into an amorphous material allows the subsequent selective heating process 132 to convert the amorphous center portion of the fin into a conductor. Thus, the invention provides a fin-type structure that can be selectively converted from a high-resistance region into a permanent low-resistance region, or conductor, using a simple heating process.

The invention presents a method of forming an antifuse and the resulting structure. The inventive method and structure produce antifuses that use fin technology. Therefore, the inventive antifuses are smaller than conventional fuses. Thus, the invention takes advantage of the fact that a fin of silicon is of very low mass (fractions of a picogram) and thus is easily heated electrically. The invention provides an inexpensive technique to make the antifuse change resistance by a large amount permanently after a pulse of heating current is passed through the fin. Because of the small area (mass) of the inventive structure, the operation of activating (blowing) the antifuse involves a simplified heating process that is performed by passing current through the antifuse. Therefore, not only does the invention produce smaller antifuses than are conventionally available, the invention also provides a method of activating the fuses that avoids the problems that can occur during conventional physical/optical antifuse activation.

Benefits which accrue include high-density and low-power encoding of data, reduced cost for repair/replacement of redundant elements, ability to self-heal or self-program elements on a chip in the field, and increased versatility for use of circuits. These inventive methods and structures may apply to logic, memory, including SRAM, DRAM, and NVRAM, as well as analog and other integrated circuits.

The foregoing description of the specific embodiments will so fully reveal the general nature of the invention that others can, by applying current knowledge, readily modify and/or adapt for various applications such specific embodiments without departing from the generic concept. Therefore, such adaptations and modifications should and are intended to be comprehended within the meaning and range of equivalents of the disclosed embodiments. It is to be understood that the phraseology or terminology employed herein is for the purpose of description and not of limitation. Therefore, while the invention has been described in terms of preferred embodiments, those skilled in the art will recognize that the invention can be practiced with modification within the spirit and scope of the appended claims.

What is claimed is:

1. A method of forming an antifuse structure, said method comprising:
    forming a material layer;
    patterning said material layer into a fin;
    converting a center portion of said fin into a substantially non-conductive region; and
    converting end portions of said fin into conductors;
    wherein said process of converting said center portion of said fin into a substantially non-conductive region allows a subsequent process of heating said fin above a predetermined temperature to convert said substantially non-conductive region into a conductor.

2. The method in claim 1, wherein said process of converting said center portion of said fin into a substantially non-conductive region comprises:
    masking ends of said fin such that a center portion of said fin is unprotected; and
    implanting ions into said center portion of said fin.

3. The method in claim 1, wherein said process of converting said center portion of said fin into a substantially non-conductive region changes said center portion of said fin into an amorphous material.

4. The method in claim 1, wherein said process of converting said center portion of said fin into a substantially non-conductive region changes said center portion into amorphous silicon and said heating of said fin changes said center portion of said fin into polycrystalline silicon.

5. The method in claim 1, wherein said process of converting said end portions of said fin into conductors comprises:
    protecting said center portion of said fin; and
    siliciding said end portions of said fin.

6. The method in claim 1, wherein said heating of said fin changes a conductivity level of said center portion of said fin to be approximately 10 times more conductive after being heated above said predetermined temperature when compared to a conductivity level of said center portion before heating.

7. A method of forming an antifuse structure, said method comprising:
    forming a material layer;
    patterning said material layer into a fin;
    converting end portions of said fin into a P-type end and an N-type end;
    converting a center portion of said fin into a P-N junction; and
    wherein said process of converting said center portion of said fin into said P-N junction allows a subsequent process of heating said fin above a predetermined temperature to permanently change characteristics of said P-N junction.

8. The method in claim 7, wherein said process of converting said center portion into a P-N junction comprises:
   masking ends of said fin such that a center portion of said fin is unprotected;
   implanting ions into said center portion of said fin; and
   after said process of converting said end portions of said fin, heating said fin sufficiently to drive impurities from said ends of said fin into said center of said fin.

9. The method in claim 8, wherein said process of implanting ions into said center portion of said fin changes said center portion of said fin into an amorphous material.

10. The method in claim 7, wherein said process of converting said end portions of said fin into conductors comprises:
   protecting said center portion of said fin;
   protecting said N-type end and implanting P-type impurities into said P-type end; and
   protecting said P-type end and implanting N-type impurities into said N-type end.

11. The method in claim 10, wherein said N-type impurities and said P-type impurities comprise opposite type impurities.

12. The method in claim 7, wherein said heating of said fin changes mid-gap density of states of said center portion of said fin to be approximately 100 times lower than mid-gap density of states of said center portion of said fin before heating.

13. A method of forming an antifuse structure, said method comprising:
   forming a material layer;
   patterning said material layer into a fin;
   converting a center portion of said fin into a substantially non-conductive region; and
   converting end portions of said fin into conductors;
   wherein said process of converting said center portion of said fin into a substantially non-conductive region allows a subsequent process of heating said fin above a predetermined temperature to convert said substantially non-conductive region into a conductor, and
   wherein said process of converting said center portion of said fin into a substantially non-conductive region changes said center portion of said fin into an amorphous material.

14. The method in claim 13, wherein said process of converting said center portion of said fin into a substantially non-conductive region comprises:
   masking ends of said fin such that a center portion of said fin is unprotected; and
   implanting ions into said center portion of said fin.

15. The method in claim 13, wherein said process of converting said center portion of said fin into a substantially non-conductive region changes said center portion into amorphous silicon and said heating of said fin changes said center portion of said fin into polycrystalline silicon.

16. The method in claim 13, wherein said process of converting said end portions of said fin into conductors comprises:
   protecting said center portion of said fin; and
   siliciding said end portions of said fin.

17. The method in claim 13, wherein said heating of said fin changes a conductivity level of said center portion of said fin to be approximately 10 times more conductive after being heated above said predetermined temperature when compared to a conductivity level of said center portion before heating.

* * * * *